US006936826B2

(12) United States Patent
Casa et al.

(10) Patent No.: US 6,936,826 B2
(45) Date of Patent: Aug. 30, 2005

(54) VIBRATION-ISOLATING COUPLING INCLUDING AN ELASTOMER DIAPHRAGM FOR SCANNING ELECTRON MICROSCOPE AND THE LIKE

(75) Inventors: Neil S. Casa, Arlington, MA (US); Kenneth H. Braun, Littleton, MA (US); Michael R. Busky, Berlin, MA (US)

(73) Assignee: Soluris, Inc., Concord, MA (US)

( * ) Notice: Subject to any disclaimer, the term of this patent is extended or adjusted under 35 U.S.C. 154(b) by 703 days.

(21) Appl. No.: 10/007,484

(22) Filed: Nov. 7, 2001

(65) Prior Publication Data

US 2004/0227100 A1 Nov. 18, 2004

(51) Int. Cl.⁷ ............................................... H01J 37/18
(52) U.S. Cl. .................. 250/441.11; 250/310; 250/311; 250/306; 250/307; 359/391; 359/383; 359/368
(58) Field of Search ....................... 250/441.11; 33/613; 359/391, 383; 73/663

(56) References Cited

U.S. PATENT DOCUMENTS 5,306,918 A * 4/1994 Goudonnet et al. ..... 250/442.11

* cited by examiner

Primary Examiner—Nikita Wells
Assistant Examiner—Zia R. Hashmi
(74) Attorney, Agent, or Firm—Cohen, Pontani, Lieberman & Pavane

(57) ABSTRACT

A coupling in a metrology system for placement between a floating inspection chamber and a fixed transfer chamber. The coupling prevents transfer of vibrations between the chambers and seals a passage between the chambers. The coupling includes a first flange attached to the inspection chamber, a second flange not in contact with the first flange and attached to the transfer chamber, and a looped diaphragm having an outer peripheral edge region secured to the first flange and an inner peripheral edge region secured to the second flange to thereby couple the flanges together and close a space between the flanges. Clamps are provided for securing the outer and inner peripheral edge regions of the diaphragm to the first and second flanges, respectively.

32 Claims, 14 Drawing Sheets

VIBRATION-ISOLATING COUPLING INCLUDING AN ELASTOMER DIAPHRAGM FOR SCANNING ELECTRON MICROSCOPE AND THE LIKE

FIELD OF THE INVENTION

The invention is directed generally to a coupling for connecting two chambers which isolate vibrations so that vibrations generated in one of the chambers are not transferred to the other chamber. More particularly, this invention is directed to a coupling including an elastomer diaphragm arranged between two processing chambers and capable of isolating vibrations so that vibrations generated in one of the chambers are not transferred to the other chamber while, at the same time, sealing the atmosphere in the chambers from the ambient atmosphere.

BACKGROUND OF THE INVENTION

Imaging systems are used in such fields as microelectronics, medicine, biology, genetic engineering, mapping and even astronomy. The imaging device can be a suitable type of microscope or, in the case of astronomy, a telescope. The demand for image accuracy is high and, therefore, the influence of noise in a signal derived by the imaging system from an imaged object must be minimized.

For reasons of convenience and efficiency, the invention will be described in the microelectronics environment, although another environment could also have been chosen. During the manufacture of very large scale integration (VLSI) semiconductor devices, measurements are made at several stages of the manufacturing process to determine whether particular features on the object are within specified design tolerances. If not, then suitable corrective action is taken quickly.

As is well known, such a manufacturing process produces a wafer which is divided into dies. Each die has a large number of electronic components. These components are defined by what can generally be termed "features" in the sense that a feature is detectable by a microscope as a foreground element distinguishable from a background, or vice versa, and having a dimension such as width. To measure that width the edges of the feature must be located accurately. "Edge" is a term used to signify detectable discontinuities in a signal obtained by imaging the feature (in any environment, not only microelectronics). The goal of edge detection is to accurately locate the transitions despite the influence of blurring and the presence of noise.

As technology has succeeded to increase the component density per die, the feature dimensions have shrunk to significantly below a micrometer. Consequently, the measurement equipment must measure submicrometer dimensions with lower allowable error tolerances.

Automated systems have been developed for making these measurements to replace manual systems in order to obtain higher process yields, to reduce exposure of the wafers to contamination and to provide a higher throughput. One example of an automated system is disclosed in U.S. Pat. No. 4,938,600. As shown in FIG. 1 which is taken from that patent, and explained in greater detail below, an image of a feature is recorded through a microscope and the recorded image is then processed electronically to obtain the required measurements. One such automated system is the Model IVS-120 metrology system manufactured by Schlumberger Verification Systems of Concord, Mass., a division of Schlumberger ATE Products. The major elements of the system, including a wafer handler, an optical system and a computer system, are mounted in a cabinet (not shown).

The wafer handler includes a cassette wafer holder 112 which contains wafers to be measured, a prealigner 114, a wafer transport pick mechanism (e.g., robotic transfer arms, not shown) for moving the wafers and a measurement stage 118 which holds the wafers during the actual measurement operation. During operation, the wafer transport pick mechanism removes a wafer 116 from cassette 112 and places it on prealigner 114. Prealigner 114 then rotates wafer 116 to a predetermined orientation by sensing a mark, a flat spot or notched edge on wafer 116, after which the wafer transport pick mechanism transfers wafer 116 from prealigner 114 to measurement stage 118 and positions wafer 116 in a horizontal orientation. Stage 118 is movable in three dimensions for precisely positioning wafer 116 relative to the optical system for performing the actual measurement.

The optical system includes microscope 120 and video camera 122 positioned above the measurement stage 118 and wafer 116. Microscope 120 typically has a turret carrying several objective lenses providing a desired range of magnification and is mounted so that microscope 120 and camera 122 have a vertical optical axis which is perpendicular to the wafer surface.

A feature to be measured on wafer 116 is located with microscope 120 in a well known manner by the movable measurement stage 118 until the feature is in the field of view of the objective lens. The optical system is focused, and a focused image of the feature is digitized and recorded by the camera 122. The image is then stored or "frozen".

The system is controlled by a computer 130. Coupled to the computer 130 are a monitor 132 for display of the image recorded by the camera 122 and text, and a keyboard 136 (which constitute an input terminal for entering operator commands) and a disk drive 138 for storing system software and data.

Image processor 128 uses software algorithms to locate the edges of the selected feature and make a measurement. Computer 130 then displays the measurement data on screen, prints a hard copy or transfers the data directly to a host computer (not shown) for centralized data analysis. Once the process is complete, wafer 116 is returned to cassette 112 by the wafer handler.

One modification to the above system entails placement of the measurement stage in a vacuum inspection chamber which is maintained at vacuum pressure. Since the cassette 112 is usually in the ambient atmosphere, one or more chambers, often referred to as transfer chambers, are interposed between the ambient atmosphere and the inspection chamber for facilitating transfer of the wafers between the inspection chamber and the ambient atmosphere. The transfer chamber is alternatingly depressurized and repressurized. It is depressurized to the vacuum pressure in the inspection chamber, to enable transfer of an incoming wafer from the transfer chamber to the inspection chamber and transfer of an inspected, outgoing wafer from the inspection chamber to the transfer chamber. It is repressurized to atmospheric pressure to enable transfer of an inspected, outgoing wafer from the transfer chamber to the ambient atmosphere and transfer of an incoming wafer from the ambient atmosphere to the transfer chamber. To this end, gate valves are associated with each transfer chamber to isolate the vacuum environment from the ambient atmosphere during the transfer of the wafers between the inspection chamber and the ambient atmosphere. While in the transfer chamber, the wafers are usually placed on paddles or pedestals.

Typically, the inspection chamber is mounted on a vibration isolation platform which floats on an air cushion to thereby isolate the inspection chamber from environmental vibrations. The transfer chamber on the other hand is fixed to a stationary frame and since it must also be connected to the inspection chamber (to enable the transfer of wafers between the transfer chamber and the inspection chamber under vacuum pressure), vibrations of the transfer chamber are unavoidably transferred to the inspection chamber. Vibrations of the transfer chamber arise for example, during the depressurization and repressurization of the transfer chamber when pumps and valves associated with the transfer chamber are operated to provide for the desired gas flows. Such vibrations can interfere with the wafer inspection process and can cause movement of the wafers in the inspection chamber out of a position necessary for pick up by the robotic transfer arm for subsequent removal from the inspection chamber.

Thus, one problem arising from the placement of the measurement stage in a vacuum chamber mounted on an isolation platform and the coupling of the vacuum chamber to a fixedly mounted transfer chamber is the transfer of vibrations from the transfer chamber to the vacuum chamber.

One way to overcome this problem is to stop the inspection of wafers in the inspection chamber while the transfer chamber is operating, i.e., is being depressurized or repressurized. This, however, significantly reduces the throughput of the wafer inspection process since the transfer chamber and the inspection chamber are not operated simultaneously.

One proposed solution to avoid such a reduction in throughput is to make the transfer chamber relatively large to enable multiple wafers to be held therein. In this manner, the frequency of the depressurization and repressurization of the transfer chamber is reduced and the wafer inspection process could therefore be conducted for longer time periods. However, problems with this type of construction include the fact that the transfer chamber is quite large and occupies an excessive amount of precious space (space in a clean room in which the transfer chamber is situated is costly). Also, in view of the large volume of the transfer chamber, it takes longer to depressurize and repressurize. Thus, the problem of the reduction in throughput of the wafer inspection process is not entirely overcome.

Other constructions have, therefore, been sought to prevent the transfer of vibrations from the transfer chamber to the inspection chamber without reducing throughput of the wafer inspection process.

One solution, which not only prevents transfer of some vibrations from the transfer chamber to the inspection chamber but also seals the vacuum environment in the transfer chamber and inspection chamber from the ambient atmosphere, is to provide a coupling having a stiff, edge-welded metal bellows between the transfer chamber and the inspection chamber as shown in FIG. 1A. The bellows 140 surrounds a passage 142 between a transfer chamber 144 and an inspection chamber 146 through which wafers are passed. One edge of the bellows is coupled to the inspection chamber and the other edge is coupled to the transfer chamber. Since the metal bellows is oriented in an axial direction of the passage between the transfer chamber and inspection chamber, its axial ends are secured to the chambers and it is stiff when subjected to shear forces but yielding when subjected to axial compression. In other words, vibrations of the transfer chamber acting in an axial direction of the bellows are generally isolated by the bellows and not transferred through the bellows to the inspection chamber but vibrations of the transfer chamber acting in a transverse direction of the bellows are not adequately isolated in view of the particular construction of the bellows.

Moreover, the vibration isolation provided by the metal bellows is not entirely satisfactory because vibrations at frequencies of up to about 60–100 Hz can still be transferred from the transfer chamber through the bellows to the inspection chamber, and vibrations at these frequencies are not damped by the air cushion on which the inspection chamber floats.

OBJECTS AND SUMMARY OF THE INVENTION

Accordingly, one object of the present invention is to provide a new and improved coupling between a transfer or transfer chamber fixed in position and an inspection chamber floating on a vibration isolation system.

Another object of the present invention is to provide a new and improved coupling between a transfer or transfer chamber fixed in position and an inspection chamber floating on a vibration isolation system which isolates the inspection chamber from vibrations arising during operation of the transfer chamber and, particularly, all vibrations at frequencies above about 3–5 Hz.

A further object of the present invention is to provide a new and improved coupling between a transfer or transfer chamber fixed in position and an inspection chamber floating on a vibration isolation system while maintaining the integrity of a vacuum present in these chambers, i.e., preventing leaks of ambient air into the chambers.

Another object of the present invention is to provide a new and improved coupling between a transfer or transfer chamber fixed in position and an inspection chamber floating on a vibration isolation system which enables operation of the inspection process, e.g., a metrology process, simultaneously with operation of the transfer chamber, e.g., depressurization and repressurization.

Yet another object of the present invention is to provide a diaphragm for use in a coupling between two chambers for preventing transfer of vibrations between the chambers and sealing an atmosphere in the chambers from the ambient atmosphere.

It is yet another object of the present invention to provide a new and improved wafer inspection process in which the throughput of the wafers is increased in comparison with prior art processes by isolating an inspection chamber in which the wafers are inspected from vibrations of a transfer or transfer chamber interposed between the inspection chamber and ambient atmosphere.

These and other objects are attained in accordance with one aspect of the present invention directed to a coupling between first and second chambers for preventing transfer of vibrations between the chambers and for sealing a passage between the first and second chambers. A first flange is adapted to be attached to the first chamber, and it has a first internal conduit and an inner periphery. A second flange is adapted to be attached to the second chamber, and it has a second internal conduit in alignment with the first internal conduit to thereby form the passage between the first and second chambers. The second flange has an outer periphery in opposed relationship to the inner periphery of the first flange to thereby define a space between the first and second flanges which is in flow communication with the first and second internal conduits. A looped diaphragm has an outer peripheral edge region secured to the first flange and an inner peripheral edge region secured to the second flange to thereby couple the first and second flanges together and close the space between the first and second flanges in order to seal the first and second internal conduits from the ambient atmosphere.

Another aspect of the present invention directed to a coupling between first and second chambers for preventing transfer of vibrations between the chambers and for sealing a passage between the first and second chambers. In the coupling, a first flange is adapted to be attached to the first chamber, and it has a first internal conduit. A second flange is adapted to be attached to the second chamber, and it has a second internal conduit in alignment with the first internal conduit to thereby form the passage between the first and second chambers. The second flange is separated from the first flange such that a space is defined between the first and second flanges in flow communication with the first and second internal conduits. A diaphragm comprising at least one elastomer layer is secured to the first and second flanges to thereby couple the first and second flanges together and close the space between the first and second flanges in order to seal the first and second internal conduits from the ambient atmosphere.

Yet another aspect of the present invention is directed to a coupling between a floating inspection chamber and a fixed transfer chamber for preventing transfer of vibrations between the chambers and sealing a passage between the chambers, which coupling comprises a first flange attached to the inspection chamber, a second flange not in contact with the first flange and attached to the transfer chamber and a looped diaphragm having an outer peripheral edge region secured to the first flange and an inner peripheral edge region secured to the second flange to thereby couple the flanges together and close a space between the flanges. Clamps are provided for securing the outer and inner peripheral edge regions of the diaphragm to the first and second flanges, respectively.

The diaphragm has a particular size and shape so that a portion of the diaphragm is movable between the flanges and isolates most vibrations from the transfer chamber. Vibrations above a frequency of about 3–5 Hz which arise during operation of the transfer chamber are thus not transferred through the diaphragm to the inspection chamber so that operation of the inspection chamber can be continued during operation of the transfer chamber. Vibrations at lower frequencies are damped out by the air isolation of the inspection chamber. Further, the material composition of the diaphragm is selected to prevent leakage of gas from the inspection chamber and thereby ensure that vacuum pressure is maintained in the inspection chamber.

In a preferred embodiment, the diaphragm comprises at least one layer of an elastomer which has a high impermeability and low out-gassing, preferably VITON™ made by the DuPont Company. To increase the impermeability of the diaphragm and reduce out-gassing from the elastomer, a metal or polymer coating can be arranged on the elastomer layer. Also, a layer of fabric can be sandwiched between two layers of elastomer to strength the diaphragm.

The coupling can be used in a metrology system between a floating inspection chamber and a fixed transfer chamber with the coupling being connected on one side to the inspection chamber and on the other side to the transfer chamber. The coupling can also be used between any two chambers whereby it is desired to prevent vibrations arising in one chamber from being transferred to the other chamber.

BRIEF DESCRIPTION OF THE DRAWINGS

These and other objects, aspects and features of the invention will be more clearly understood when the following detailed description is read in conjunction with the attached drawings, wherein.

DETAILED DESCRIPTION OF THE DRAWINGS

Figure 1:
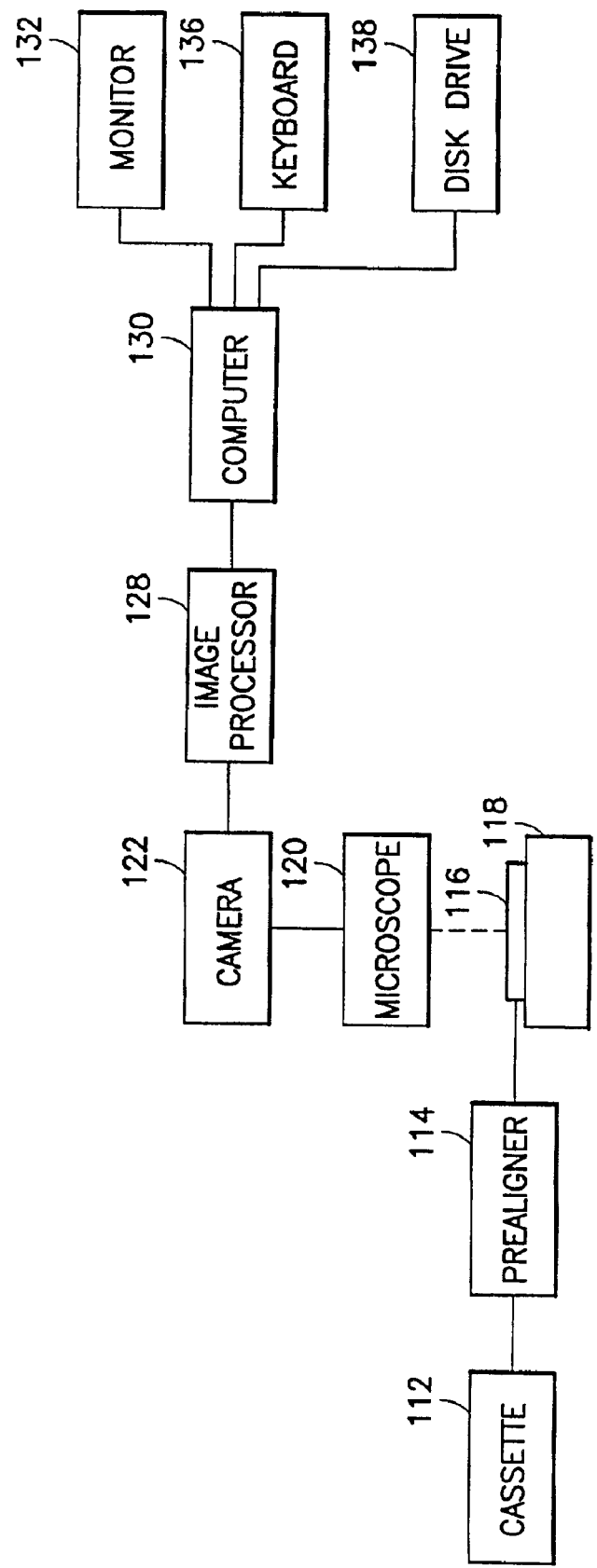
FIG. 1 is a block diagram of a prior art automated measurement system for providing optical measurements of a semiconductor device.
Figure 1A:
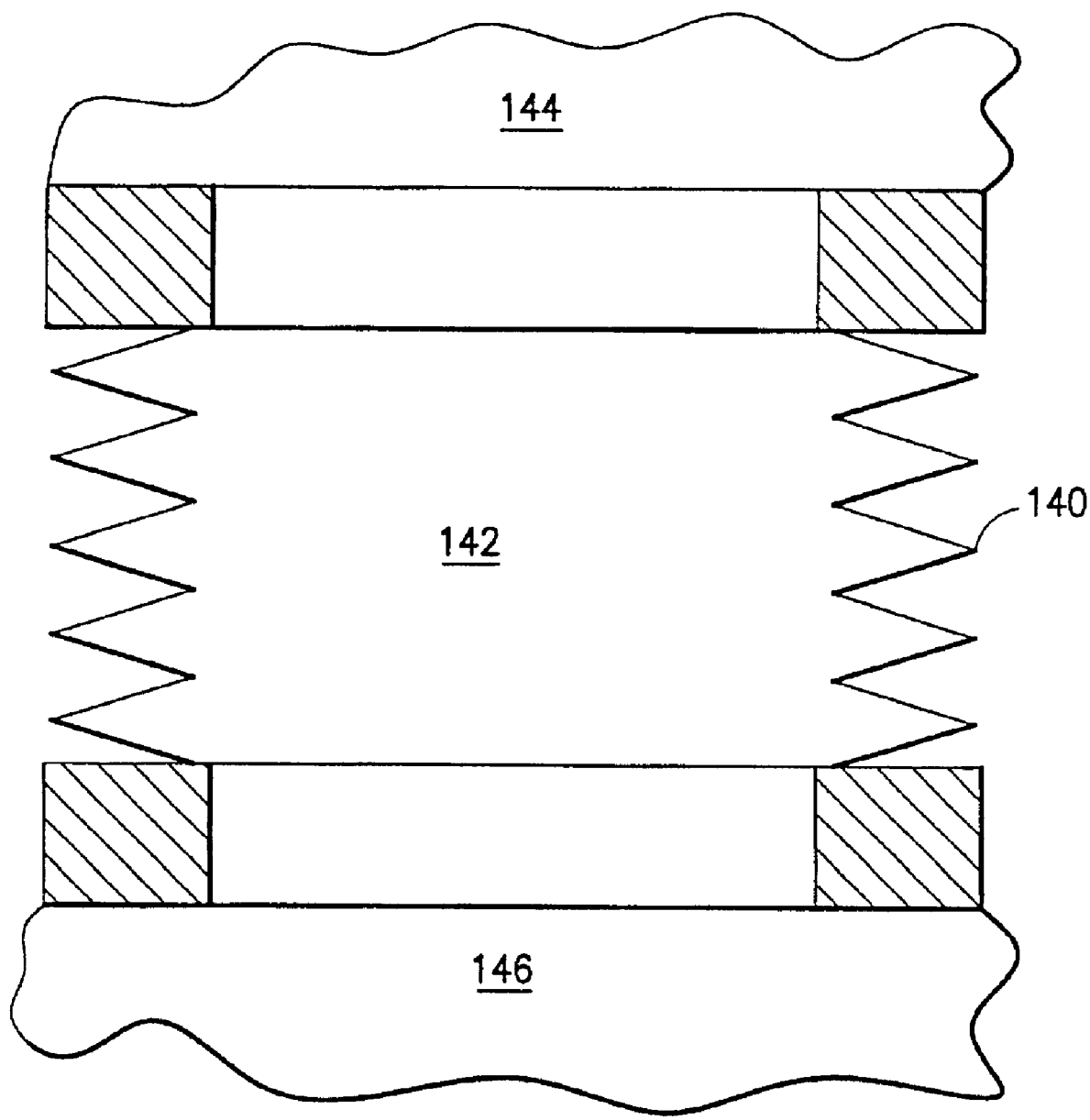
FIG. 1A is a cross-section of a prior art coupling between a vacuum chamber and a transfer chamber.
Figure 2:
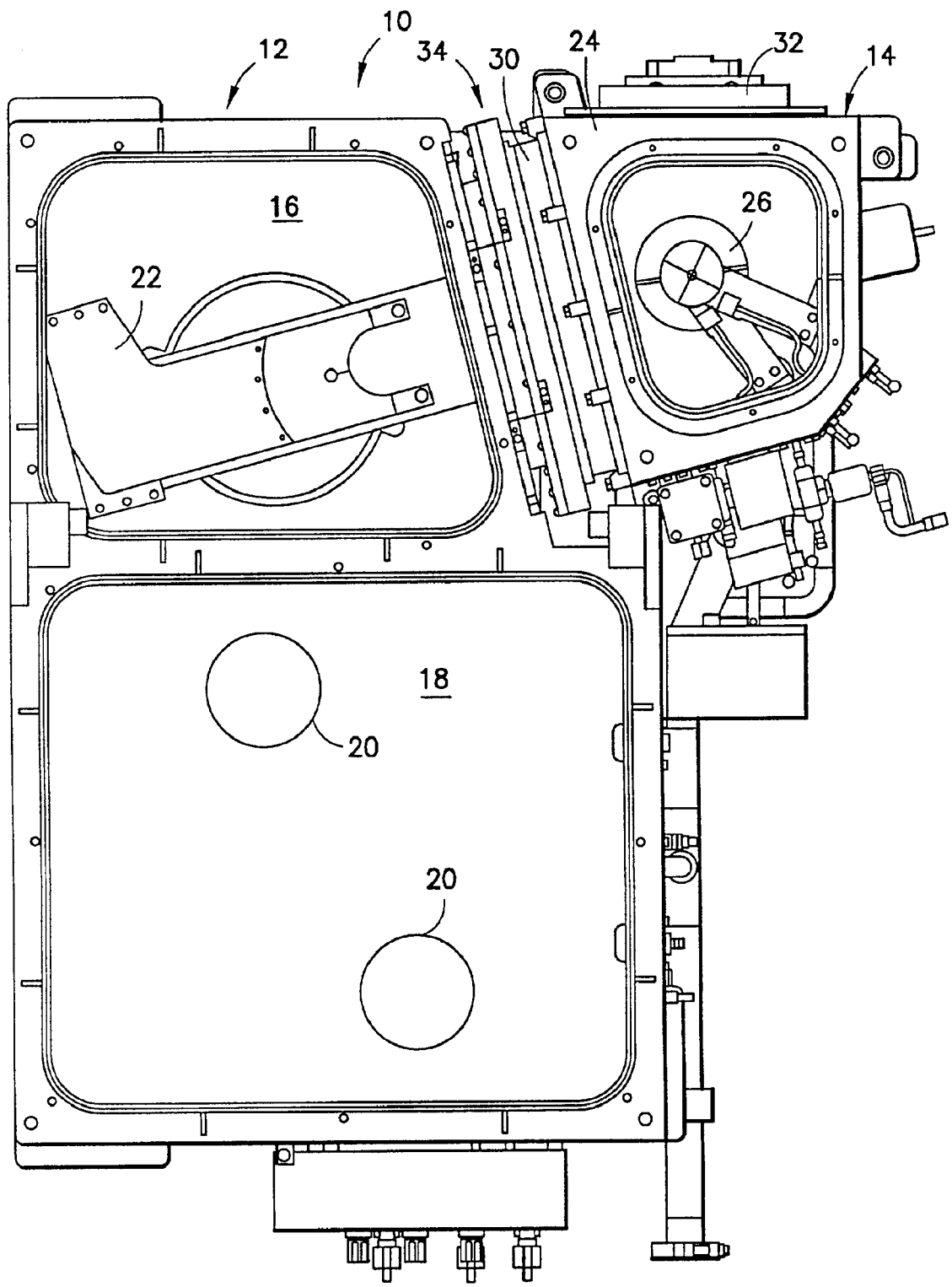
FIG. 2 is a plan view of a metrology system incorporating the coupling in accordance with the invention.

Referring first to FIG. 2, an automated measurement system in which the invention can be applied is generally designated 10 and includes an inspection chamber 12 and a transfer chamber 14. Inspection chamber 12 has a transfer portion 16 and an inspection or measurement portion 18 having a pair of measurement sites 20. A measurement device (not shown) performs a measurement or inspection of the wafers when the wafers are situated at the measurement sites 20. Inspection chamber 12 is maintained at high vacuum (e.g.,10E-6 Torr). A transfer arm 22 is situated in the inspection chamber 12 and transfers wafers between the transfer chamber 14 and the measurement portion 18 of the inspection chamber 12. The transfer chamber 14 is fixed to a support frame 24.

The inspection chamber 12 is mounted on an active vibration isolation platform (not shown) to isolate environmental vibrations. It can be of the type generally described above. Its details are not provided herein because its details are well known and because it forms no part of the invention. To isolate vibrations arising from operation of the transfer chamber 14, a floating coupling 34 is interposed between the inspection chamber 12 and the transfer chamber 14. Additional details about coupling 34 are described below with reference to FIGS. 3–12.

Transfer chamber 14 includes one or more pedestals, or paddles, 26 on which wafers (not shown) are held during transfer of the wafers between the ambient atmosphere and the inspection chamber 12. If two paddles 26 are provided, one receives an incoming wafer to be inspected while the other receives an outgoing wafer to be returned for further processing.

A first gate valve 30 is interposed between the inspection chamber 12 and the transfer chamber 14 and a second gate valve 32 is interposed between the transfer chamber 14 and the ambient atmosphere. Gate valve 30 is arranged immediately between the transfer chamber 14 and the coupling 34 so that the coupling 34 is directly connected to the inspection chamber 12 and the gate valve 30. Each gate valve 30, 32 is operable between an open position in which the atmospheres on the sides of the valve are in communication with one another and a closed position in which the atmospheres on the sides of the valve are isolated from one another. A cassette of wafers, pre-aligner and possibly other wafer handling devices such as a robotic transfer arm (not shown) are situated outside of the second gate valve 32 to place wafers onto the paddles 26 and remove the inspected wafers therefrom.

In use, gate valve 30 is initially closed while gate valve 32 is opened and a wafer is placed onto a paddle 26 in the transfer chamber 14 through the gate valve 32 from the cassette (not shown) located in the ambient atmosphere. This is an atmospheric wafer exchange since the transfer chamber 14 is at the same pressure as the ambient atmosphere. Gate valve 32 is then closed, the pressure in transfer chamber 14 is brought to substantially the same vacuum level as prevails in inspection chamber 12, and the gate valve 30 is then opened. The transfer arm 22 removes the wafer from the transfer chamber 14 and brings it into the transfer portion 16 of the inspection chamber 12. This is a vacuum wafer exchange since both the vacuum chamber 12 and the transfer chamber 14 are at substantially the same vacuum pressure. Gate valve 30 is then closed, transfer chamber 14 is repressurized, gate valve 32 is opened and another wafer is transferred from the cassette onto one of the paddles 26. During this repressurization and atmospheric wafer exchange, the transfer arm 22 moves the wafer that was brought into transfer portion 16 to a measurement site 20 in the measurement portion 18 to be inspected, and the inspection is performed. After another wafer is placed onto an available paddle in the transfer chamber 14, gate valve 32 is closed, transfer chamber 14 is depressurized and gate valve 30 is opened. The transfer arm 22 transfers the wafer from the measurement site 20 to the unoccupied paddle 26 in transfer chamber 14 so that the transfer chamber 14 will thus contain an incoming, uninspected wafer and an outgoing, inspected wafer. The transfer arm 22 then removes the incoming wafer from the transfer chamber 14. Gate valve 30 is closed, transfer chamber 14 is repressurized, and gate valve 32 is then opened. The inspected wafer is removed from the transfer chamber 14 and another incoming, uninspected wafer is placed into the transfer chamber 14. At the same time as the transfer chamber 14 is being repressurized and the outgoing, inspected wafer is removed therefrom, the transfer arm 22 places the wafer it just removed from transfer chamber 14 on a measurement site 20, and the wafer is inspected. This process is repeated until all the wafers in the cassette are inspected.

Coupling 34 will now be described with reference to FIGS. 3–12E. Coupling 34 is designed and constructed to prevent the transfer of vibrations from the transfer chamber 14 to the inspection chamber 12, such vibrations arising in the transfer chamber 14 by virtue of, for example, the operation of pumps and valves to provide for the alternating depressurization and repressurization of the transfer chamber 14. Coupling 34 is also designed to provide a seal for the vacuum in the inspection chamber 12, and also in the transfer chamber 14 when the transfer chamber 14 is in flow communication with the inspection chamber 12.

Figure 3:
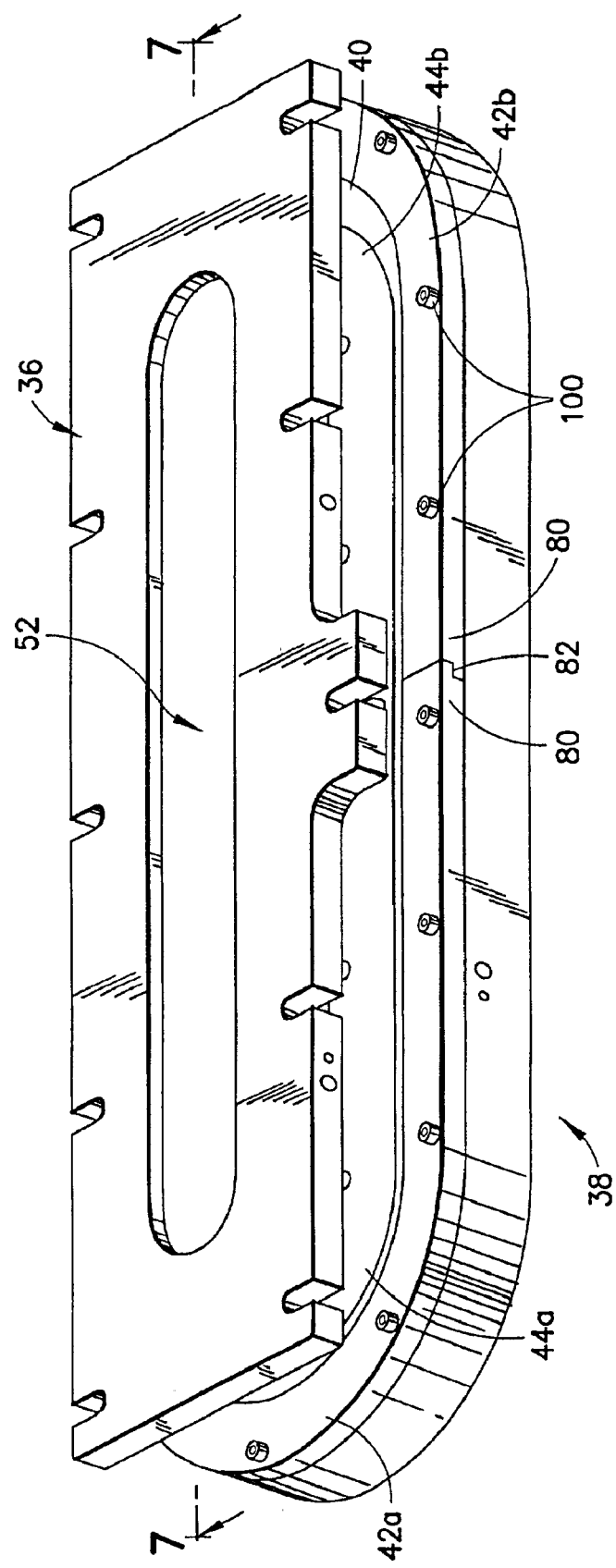
FIG. 3 is a perspective view of the coupling in accordance with the invention.
Figure 4:
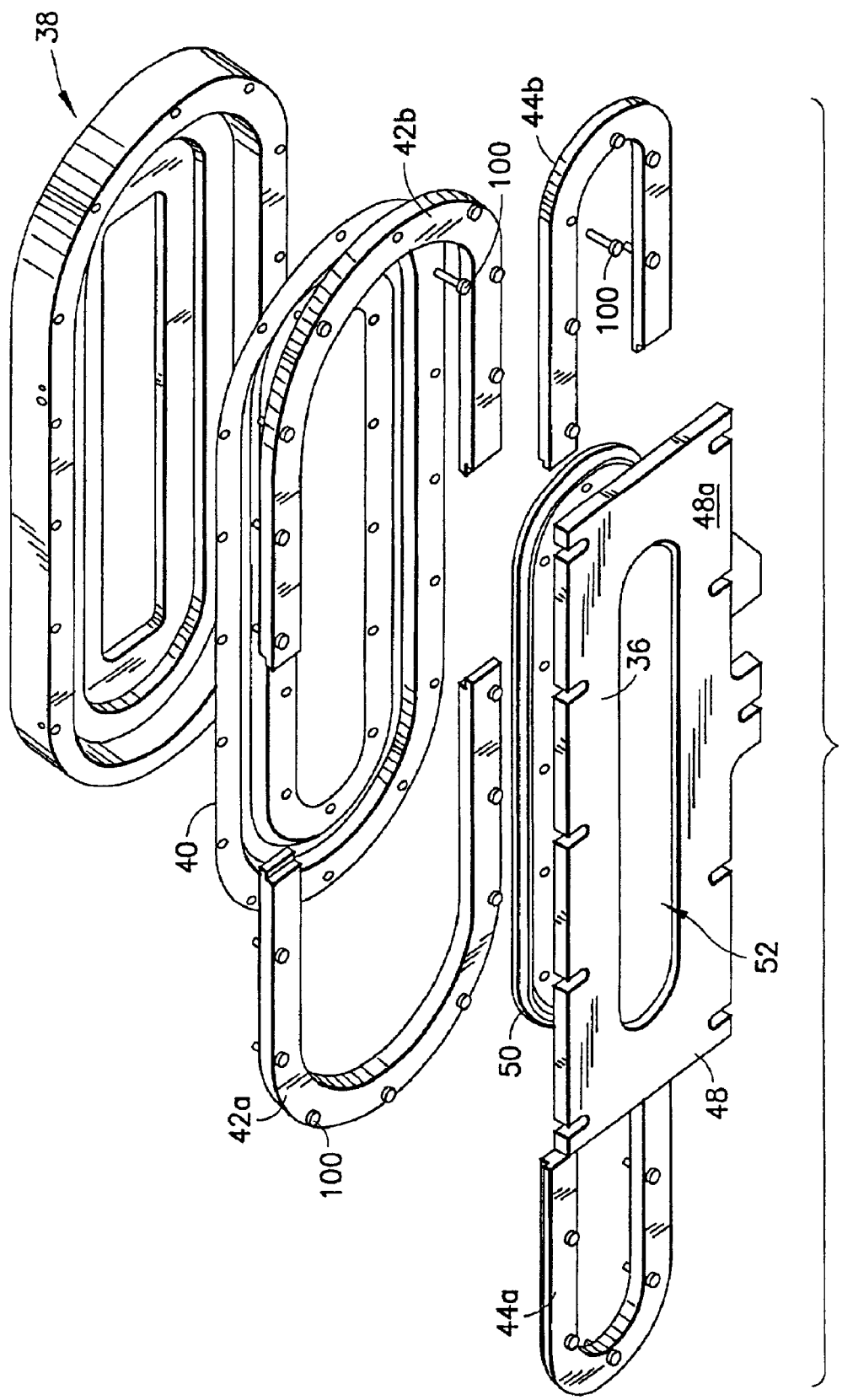
FIG. 4 is an exploded perspective view of the coupling shown in FIG. 3.
Figure 5:
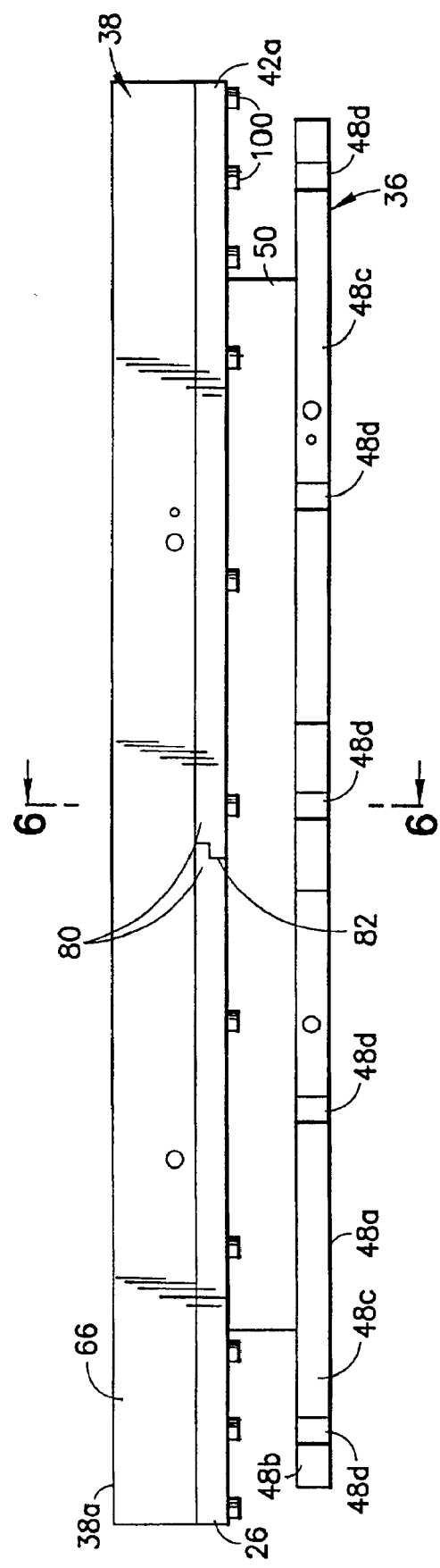
FIG. 5 is a top view of the coupling in accordance with the invention.

As shown in FIGS. 3 and 4, coupling 34 comprises a floating chamber flange 36 adapted to be attached to the inspection chamber 12, a fixed chamber flange 38 adapted to be attached to the gate valve 30 which in turn is attached to the transfer chamber 14, a diaphragm 40, fixed flange diaphragm clamps 42a, 42b for clamping an outer peripheral edge region of the diaphragm 40 to the fixed chamber flange 38, and floating flange diaphragm clamps 44a, 44b for clamping an inner peripheral edge region of the diaphragm 40 to the floating chamber flange 36. The diaphragm 40 is clamped to the flanges 36,38 so that it couples the flanges 36,38 together and also closes a space 46 (see FIGS. 6, 7) between an inner periphery of the fixed chamber flange 38 and an outer periphery of the floating chamber flange 36.

The form and shape of each of the components of the coupling 34 is described below. Generally, the coupling 34 is constructed of two separate members defining a space therebetween, one member being adapted for attachment to the inspection chamber 12 and the other being adapted for attachment to the transfer chamber 14. The attachment may be a direct connection or an indirect connection, i.e., in the latter case, the member may be attached to a gate valve which in turn is attached to the chamber. A circumferentially closed component, referred to herein as a diaphragm, extends in a radial direction and is clamped in its inner peripheral edge region to one member and in its outer peripheral edge region to the other member so that a middle portion is arranged in the space between the members and fully closes the space. The inner peripheral edge region of the diaphragm is adjacent an inner radial edge while the outer peripheral edge region of the diaphragm is adjacent an outer radial edge. One side of the diaphragm is exposed to the vacuum pressure in the inspection chamber 12 and the other side of the diaphragm is exposed to the pressure in transfer chamber 14, such as ambient atmosphere when gate valve 32 is open. The cross-sectional shape and construction of the diaphragm are designed so as to enable the diaphragm to provide flexibility in both axial and radial directions to thereby effectively isolate vibrations from the transfer chamber 14, as conveyed through the gate valve 30, and prevent such vibrations from affecting the inspection chamber 12.

Figure 8:
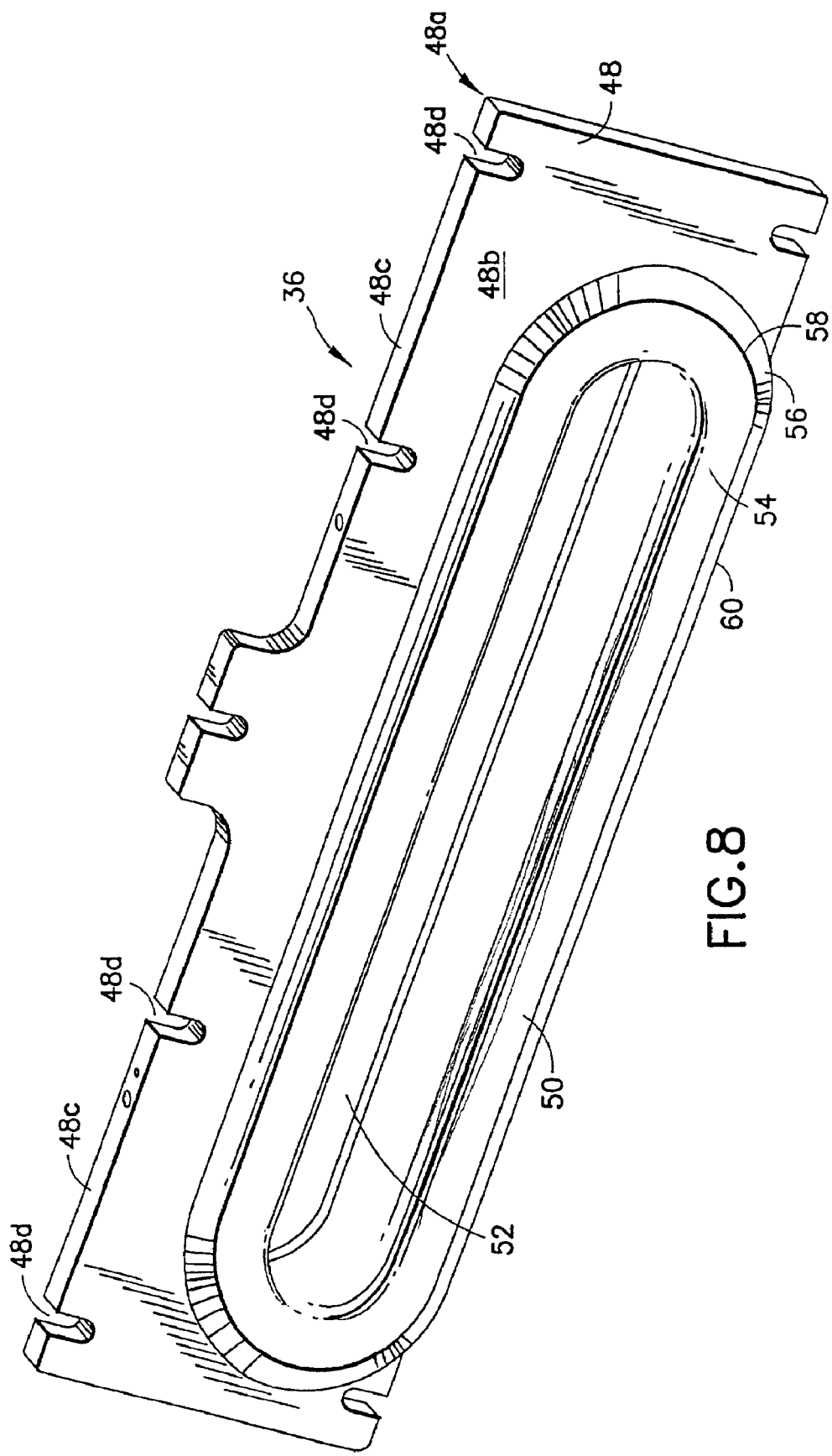
FIGS. 8 and 9 are perspective views of flanges of the coupling shown in FIG. 3.

Floating chamber flange 36 is shown more clearly in FIG. 8 and comprises a substantially rectangular plate 48 having an outer surface 48a adapted to abut a surface of the inspection chamber 12, an inner surface 48b, and an oblong-shaped tube 50 defining a throat 52. Throat 52 is sized to allow for passage of robotic transfer arm 22 therethrough and, thus, the shape of tube 50 and the throat 52 defined thereby may vary depending on the dimensions of the robotic transfer arm.

Figure 6:
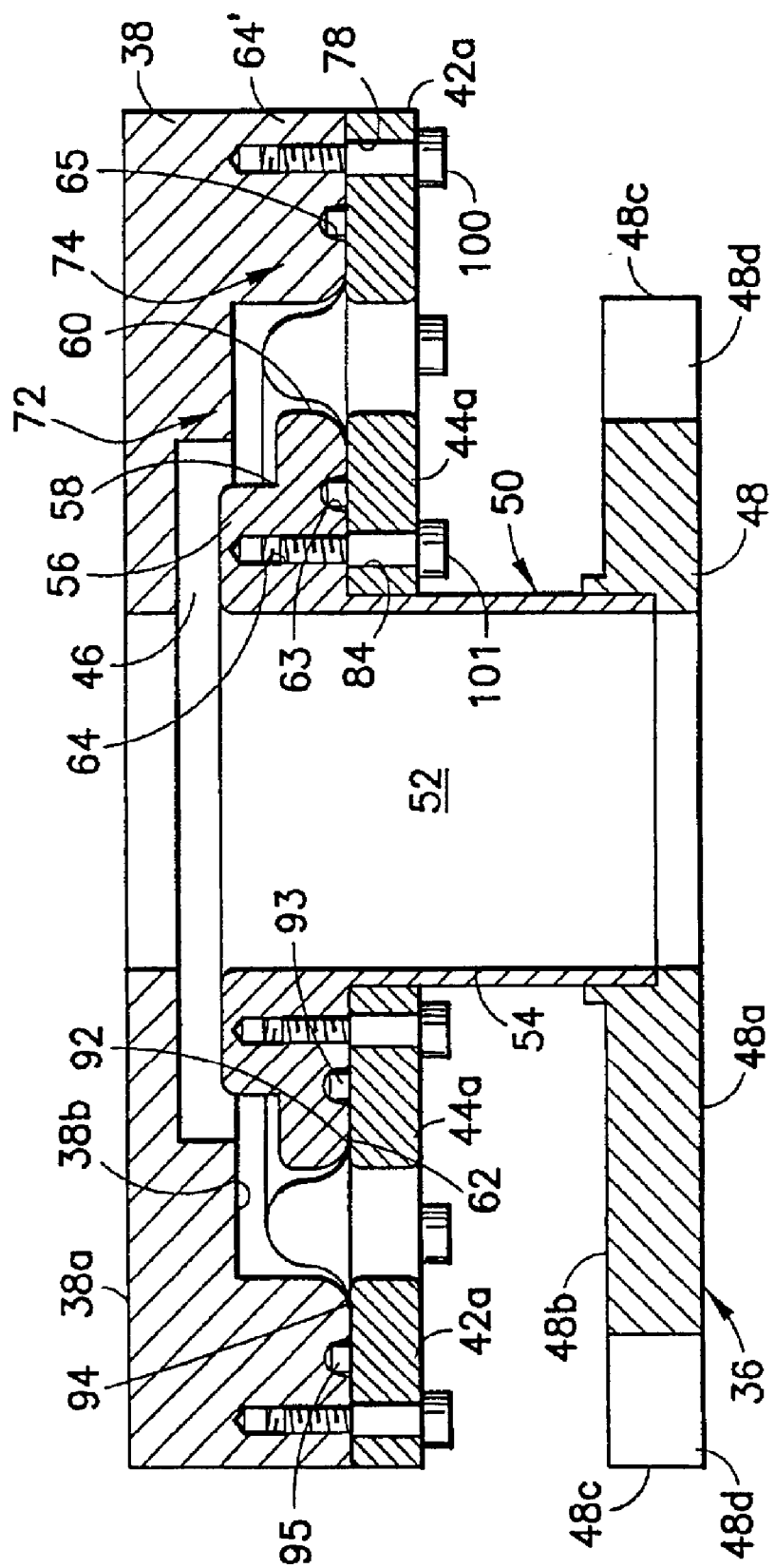
FIG. 6 is a cross-sectional view taken along the line 6—6 of FIG. 5.
Figure 7:
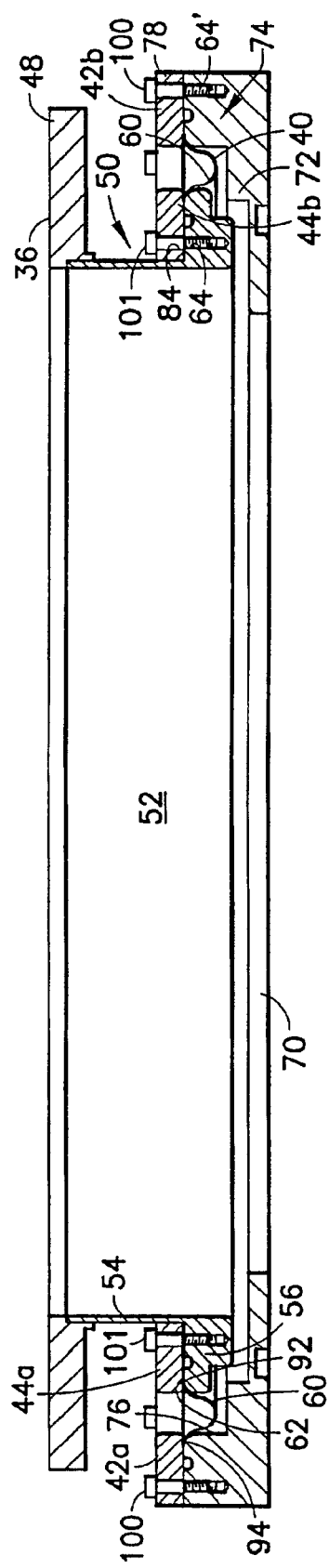
FIG. 7 is a cross-sectional view taken along the line 7—7 of FIG. 3.

As shown in FIGS. 6 and 7, the tube 50 includes a main portion 54 having a uniform cross-sectional shape and a circumferential lip 56 including a step 58. Lip 56 defines an outer periphery of the flange 36 which includes an outer peripheral wall 60. An underside surface 62 of the lip 56 has threaded holes 64. Edges 48c of the plate 48 include recesses 48d in alignment with apertures of the clamps 44a, 44b to enable screws to be inserted, as explained below.

Figure 9:
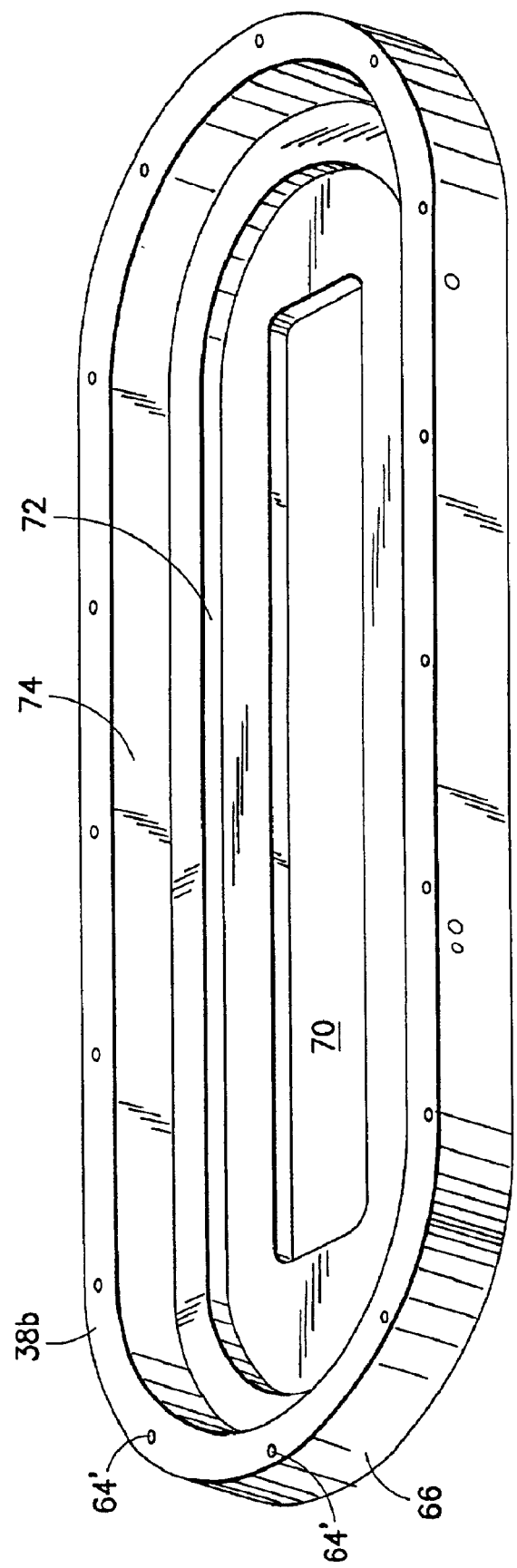

Flange 38, as shown more clearly in FIGS. 7 and 9, has an outer surface 38a adapted to abut a surface of the gate valve 30, and an inner surface 38b. Flange 38 is thus attached to the transfer chamber 14 indirectly, through the interposition of the gate valve 30. Flange 38 includes an oblong-shaped main portion 66 that includes a throat 70 in substantial alignment with throat 52 of the floating chamber flange 36, and it is also sized to allow for passage of robotic transfer arm 22 therethrough. Main portion 66 also includes two inward steps 72,74 defining an inner periphery of the flange 38. Step 74 includes an inner peripheral wall 76 and defines the inner surface 38b as shown in FIGS. 6 and 7. Inner surface 38b includes threaded holes 64'.

Figure 10:
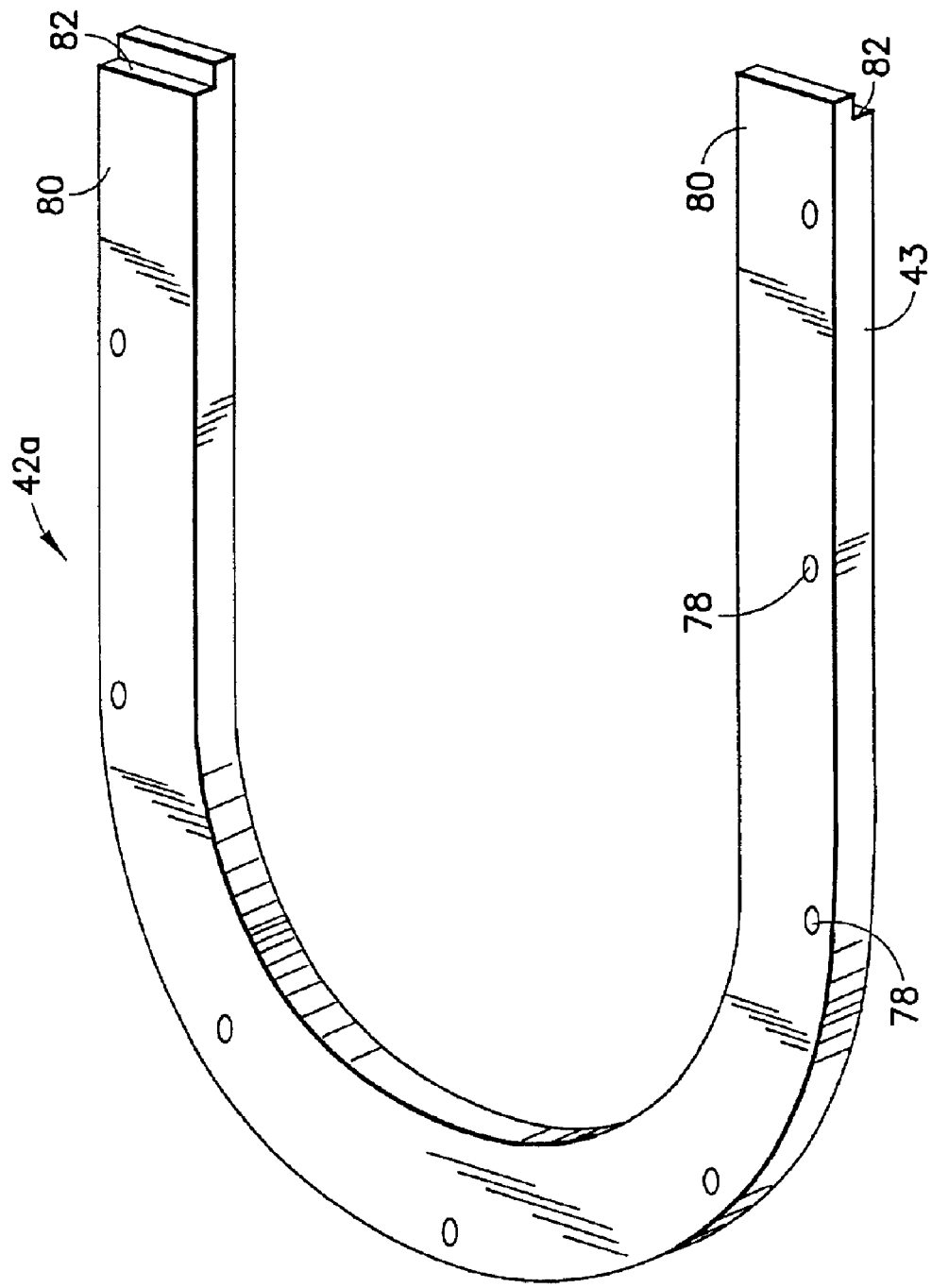
FIGS. 10 and 11 are perspective views of clamps of the coupling shown in FIG. 3.

A fixed flange diaphragm clamp 42a is shown more clearly in FIG. 10 and comprises a U-shaped member having apertures 78 proximate an outer edge 43 for passage of screws 100 to enable connection of the clamp 42a to the fixed chamber flange 38, with the outer edge 94 of the diaphragm 40 (see FIG. 12) clamped therebetween (see FIGS. 6 and 7). Outer edge 94 includes a rib 95 which is seated in recess 65 in flange 38. This arrangement creates a seal. Terminal edges 80 of clamp 42a are provided with steps 82 to allow clamp 42a to mate with complementary clamp 42b when they are opposed to one another.

Figure 11:
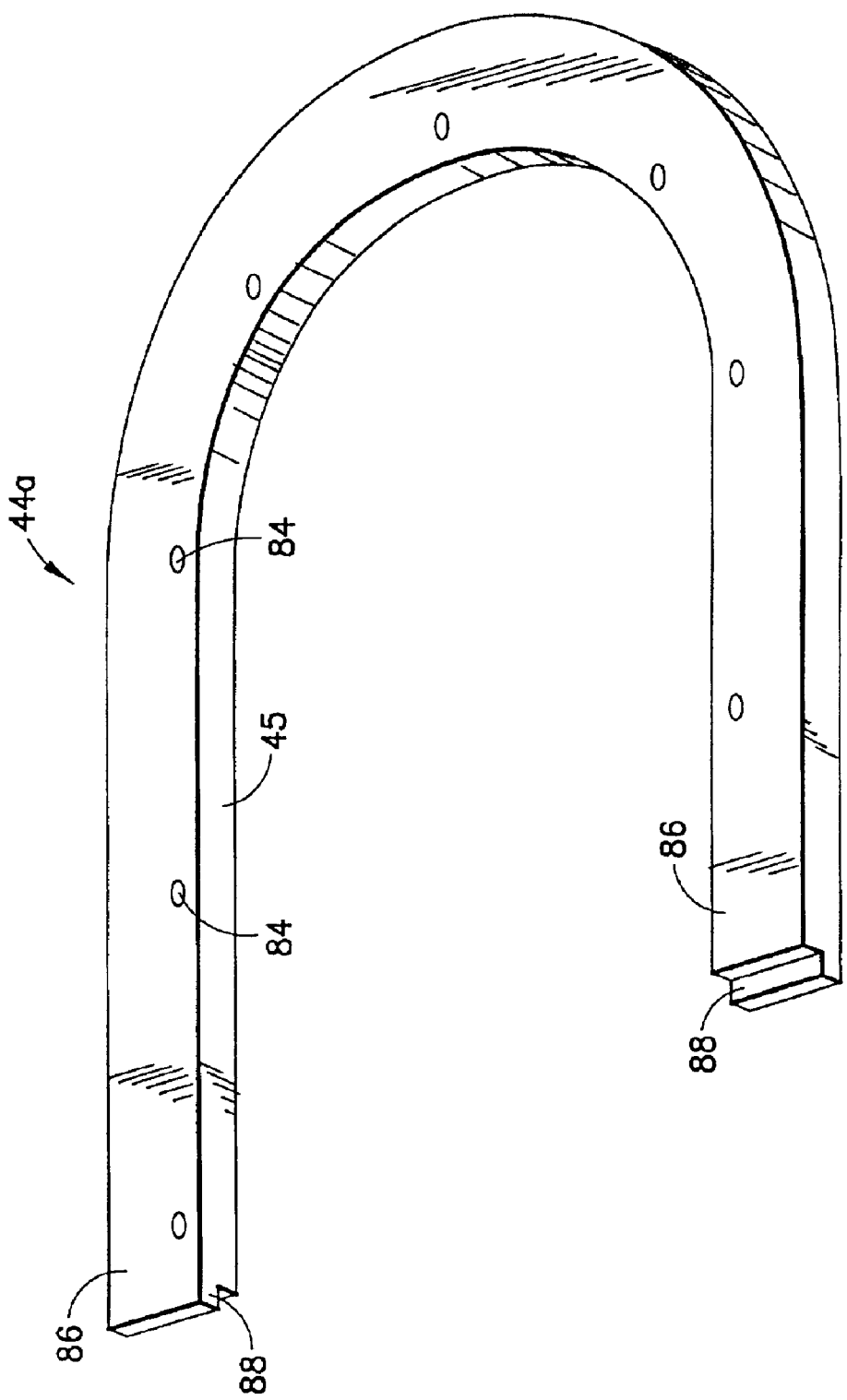

A floating flange diaphragm clamp 44a is shown more clearly in FIG. 11 and comprises a U-shaped member having thru holes 84 proximate an inner edge 45 for passage of screws 101 to enable connection of the clamp 44a to the floating chamber flange 36, with the inner edge 92 of the diaphragm 40 (see FIG. 12) clamped therebetween (see FIGS. 6 and 7). Inner edge 92 includes a rib 93 which is seated in recess 63 in lip 56. This arrangement creates a seal. Terminal edges 86 of the clamp 44a are provided with steps 88 to allow clamp 44a to mate with complementary clamp 44b when they are opposed to one another.

Figures 12, 12A:
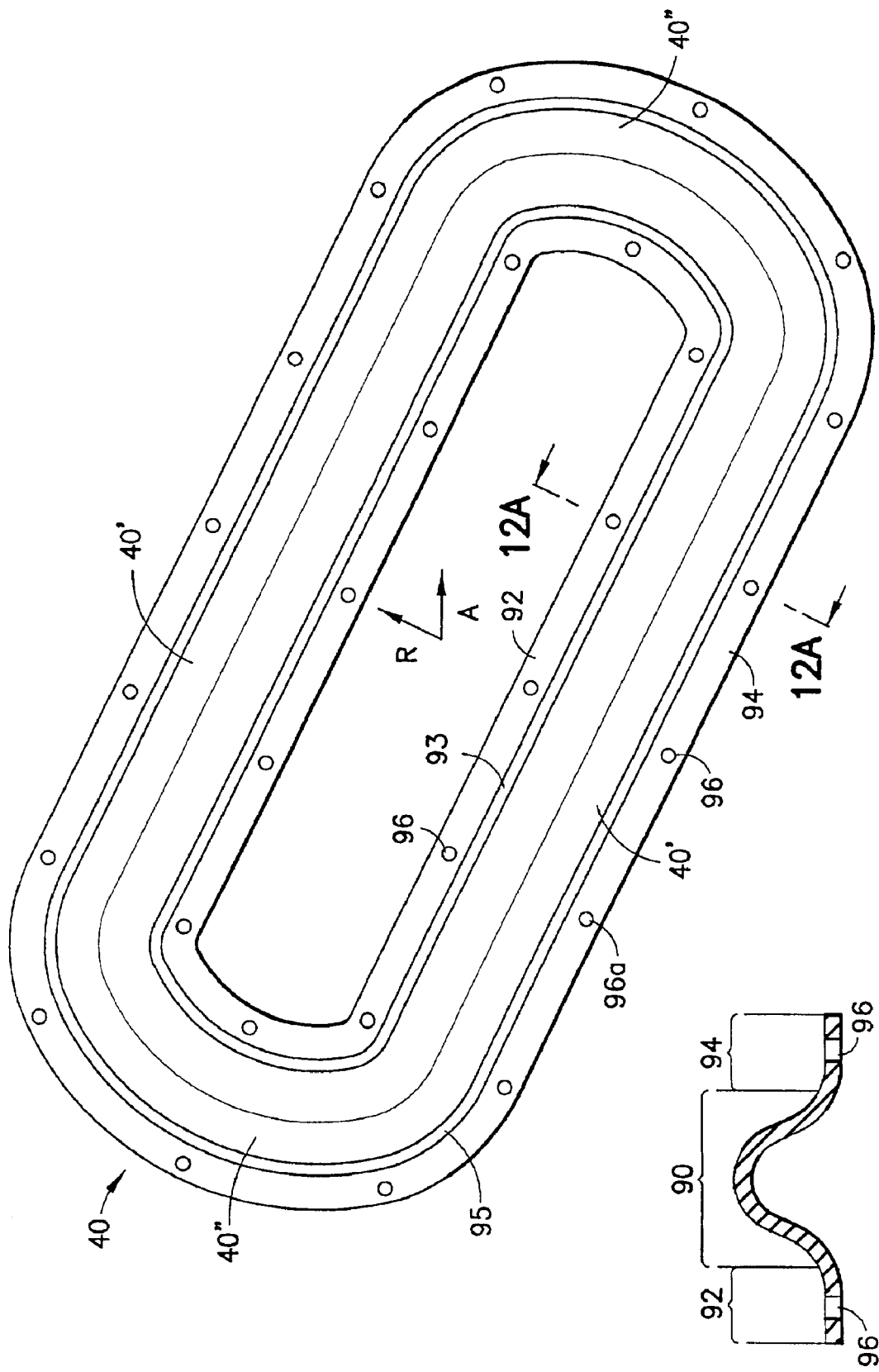
FIG. 12 is a perspective view of a diaphragm of the coupling shown in FIG. 3.
FIG. 12A is cross-sectional view taken along the line 12A—12A of FIG. 12.

The diaphragm 40 is shown more clearly in FIG. 12. Diaphragm 40 has a particular form and shape designed so as to enable it to be flexible in both axial and radial directions (denoted in FIG. 12 by arrows A and R) to thereby effectively isolate vibrations from the transfer chamber 14, as conveyed through the gate valve 30, and prevent such vibrations from affecting the inspection chamber 12.

As to its overall shape, the diaphragm 40 includes parallel straight portions 40' and arcuate portions 40" between the straight portions 40'. The dimensions of the portions 40',40" are determined by the size of the throats 52,70 in the first and second flanges 36,38 and with a view toward minimizing the area exposed to atmospheric pressure.

As to the size of the diaphragm 40, the size of portions 40',40" are selected to provide nominal operational motion of approximately 5 mm. Once the size of the diaphragm 40 is determined, the flanges 36, 38 and clamps 42a,42b and 44a, 44b can be constructed in consideration of the size of the diaphragm 40.

As to the cross-sectional shape of the diaphragm 40 in the radial direction R, the diaphragm 40 has a bell-shaped interior region 90 bounded by a substantially planar inner peripheral edge region 92 and a substantially planar outer peripheral edge region 94 (see FIG. 12A). Inner and outer edge regions 92, 94 include respective apertures 96 and 96a through which screws 100, 101 pass for clamping the diaphragm 40 between the flanges 36, 38 and the clamps 42a, 42b and 44a, 44b. As shown in FIG. 7, screws 101 pass through the apertures 84 in the floating flange diaphragm clamps 44a, 44b, then through aligned apertures 96 in the inner peripheral edge region 92 of the diaphragm 40 and then into threaded holes 64 in the underside surface 62 of the lip 56 of the floating chamber flange 36. Screws 100 pass through the apertures 78 in the fixed flange diaphragm clamps 42a, 42b then through aligned apertures 96 in the outer peripheral edge region 94 of the diaphragm 40 and then into threaded holes 64' in inner surface 38b of the fixed chamber flange 38.

The material(s) from which the diaphragm 40 is constructed is (are) selected so that the diaphragm 40 is both substantially impermeable and flexible. Impermeability is required in order to seal the space 46 between the flanges 36, 38 that is in flow communication with the inspection chamber 12, which is maintained at vacuum pressure. Flexibility is required in order to enable vibrations transferred from the transfer chamber 14 via flange 38 to be isolated rather than be transferred to inspection chamber 12 via flange 36.

Elastomers, although generally flexible, have not previously been used in diaphragm seals associated with inspection chambers of metrology systems because they are not sufficiently impermeable under high vacuum pressures (10E-6 Torr), to which the diaphragm 40 is subjected in view of its exposure to the vacuum in the inspection chamber 12, and because they out-gas, i.e., release gases.

However, in one preferred embodiment, the diaphragm 40 is made of a particular elastomer which has been found to be capable of maintaining a low permeability under high vacuum pressures without excessive out-gassing which would interfere with the metrology process, namely, an elastomer sold under the tradename VITON™ by the DuPont Company. VITON™ is a flouropolymer which is durable and flexible, and has low out-gassing, excellent performance over a wide range of temperatures and low permeability. It can also be molded in the same manner as rubber, i.e., heated and pressed into a die, in order to obtain the desired shape of the diaphragm 40.

The diaphragm 40 can be made of VITON™ alone or in combination with one of the improvements described below for increasing the impermeability and/or strength of the diaphragm 40. The improvements below could also be applied to an elastomer other than VITON™ and still provide a sufficient degree of impermeability and flexibility.

Figure 12B:
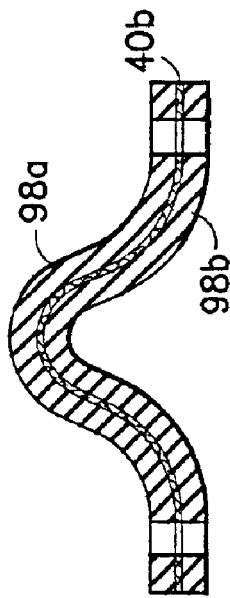
FIG. 12B is a cross-sectional view of a first embodiment of a diaphragm in accordance with the invention.

One way to increase the impermeability of the diaphragm 40 is to metalize the surface of the elastomer 98, i.e., apply a thin coating 40a of a ductile metal, such as aluminum, to the exposed surfaces of the elastomer (See FIG. 12B). The thickness of the coating 40a is on the molecular level and thus the coating 40a does not meaningfully increase the stiffness of the diaphragm 40. The metallic coating 40a on the surface of the elastomer 98 also reduces out-gassing, i.e., it inhibits release of gas from the elastomer 98.

Figure 12C:
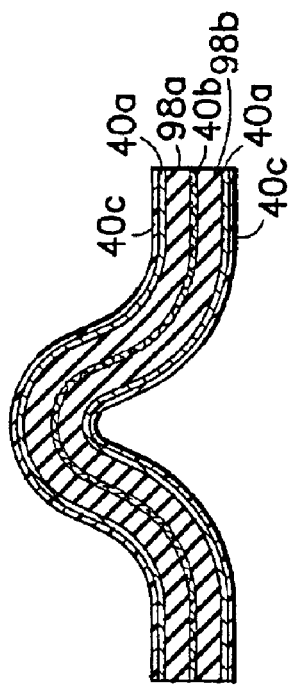
FIG. 12C is a cross-sectional view of a second embodiment of a diaphragm in accordance with the invention.

Another possible modification of the diaphragm 40 to strength the diaphragm 40 without increasing its stiffness is to sandwich a layer of fabric 40b between two layers of elastomer 98a,98b, as shown in FIG. 12C. The particular fabric 40b is selected in consideration of its strength vs. stiffness properties. It has been found that one particular fabric which has advantageous properties, in that it increases the strength of the diaphragm without a meaningful increase in the stiffness of the diaphragm, is a fabric sold by DuPont under the trademark DACRON™.

Figure 12D:
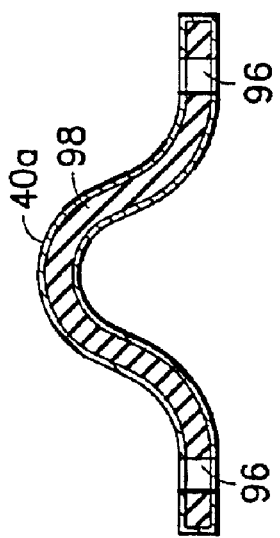
FIG. 12D is a cross-sectional view of a third embodiment of a diaphragm in accordance with the invention.

Yet another possible modification of the diaphragm 40 to increase its impermeability is to apply a polymer coating 40c to the elastomer 98, as shown in FIG. 12D. The polymer coating 40c may be applied to the elastomer 98 by vapor deposition and helps to seal the elastomer 98 while increasing its impermeability and reducing its out-gassing. It has been found that a thermoplastic polymer film known as Parylene and available from Speedline Technologies of Franklin MA provides particularly beneficial results.

Figure 12E:
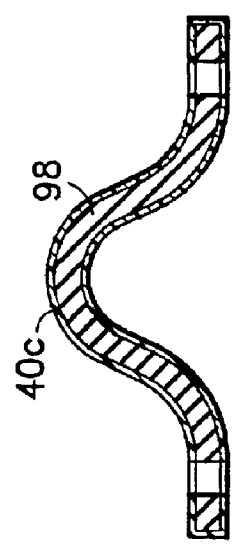
FIG. 12E is a cross-sectional view of a fourth embodiment of a diaphragm in accordance with the invention.

The features of the embodiments shown in FIGS. 12B–12D can be combined. For example, as shown in FIG. 12E, the diaphragm 40 may be constructed to include upper and lower layers of an elastomer 98a, 98b sandwiching a layer of fabric 40b therebetween, forming an aluminum coating 40a on the exposed surfaces of the elastomer layers 98a, 98b, and applying a polymer coating 40c onto the aluminum coating 40a.

Other ways for increasing impermeability of an elastomer and reducing out-gassing of an elastomer can be applied in accordance with the invention without deviating from the scope and spirit thereof.

Although a single transfer chamber is shown and described for use in a metrology system having a single inspection chamber, it is understood that the invention can be applied in metrology systems and wafer handling and transfer systems including multiple transfer chambers with a single inspection chamber or multiple transfer chambers with multiple inspection chambers, such constructions of metrology systems and wafer handling and transfer systems being known in the art. One or more of the transfer chambers in such systems could incorporate any or all of the aspects of the invention disclosed above.

Although described herein for use in a metrology system between a vacuum inspection chamber and a transfer chamber, the coupling can be used between any two types of chambers when it is desired to prevent the transfer of vibrations from one chamber to the other. In this regard, the coupling is particularly useful for placement between a floating chamber and a fixed chamber.

Although specific embodiments of the present invention have been described in detail above, various modifications thereto will be readily apparent to anyone with ordinary skill in the art. All such modifications are intended to fall within the scope of the present invention as defined by the following claims.

We claim:

1. A coupling between first and second chambers for preventing transfer of vibrations between the chambers and for sealing a passage between the first and second chambers, the coupling comprising:
   a first flange adapted to be attached to the first chamber and having a first internal conduit and an inner periphery;
   a second flange adapted to be attached to the second chamber and having a second internal conduit in alignment with said first internal conduit to thereby form the passage between the first and second chambers, said second flange having an outer periphery in opposed relationship to said inner periphery of said first flange to thereby define a space between said first and second flanges which is in flow communication with said first and second internal conduits; and
   a looped diaphragm having an outer peripheral edge region secured to said first flange and an inner peripheral edge region secured to said second flange to thereby couple said first and second flanges together and close said space between said first and second flanges in order to seal said first and second internal conduits from the ambient atmosphere.

2. The coupling of claim 1, wherein said diaphragm includes a middle portion arranged between said inner and outer peripheral edge regions and is attached to said first and second flanges such that said middle portion is arranged between said first and second flanges.

3. The coupling of claim 2, wherein said middle portion of said diaphragm has a bell-shape in a radial cross-section.

4. The coupling of claim 1, wherein said diaphragm is flexible.

5. The coupling of claim 1, wherein said diaphragm comprises at least one elastomer layer.

6. The coupling of claim 5, wherein said at least one elastomer layer is made of VITON™.

7. The coupling of claim 5, wherein said diaphragm further comprises reduction means for reducing at least one of the permeability and out-gassing of said at least one elastomer layer.

8. The coupling of claim 5, wherein said diaphragm further comprises an aluminum coating arranged on said at least one elastomer layer.

9. The coupling of claim 5, wherein said diaphragm further comprises a polymer coating arranged on said at least one elastomer layer.

10. The coupling of claim 1, wherein said diaphragm further comprises reinforcement means for strengthening said diaphragm without increasing stiffness of said diaphragm.

11. The coupling of claim 1, wherein said at least one elastomer layer comprises first and second elastomer layers, said diaphragm further comprising a fabric layer interposed between said first and second elastomer layers.

12. The coupling of claim 1, wherein said at least one elastomer layer comprises first and second elastomer layers, said diaphragm further comprising a fabric layer interposed between said first and second elastomer layers, an aluminum coating arranged on outer surfaces of said first and second elastomer layers and a polymer coating arranged on said aluminum coating.

13. The coupling of claim 1, wherein said first flange has an inner peripheral wall defining a portion of said inner periphery and said second flange has an outer peripheral wall defining a portion of said outer periphery and in opposed relationship to said inner peripheral wall of said first flange to thereby define a portion of said space between said first and second flanges.

14. The coupling of claim 13, wherein said diaphragm includes a middle portion arranged between said inner and outer peripheral edge regions and is attached to said first and second flanges such that said middle portion is arranged between said inner and outer walls.

15. The coupling of claim 14, wherein said middle portion of said diaphragm has a bell-shape in a radial cross-section, with one side of said bell-shaped middle portion being arranged opposite said inner wall and an opposite side of said bell-shaped middle portion being arranged opposite said outer wall.

16. The coupling of claim 1, further comprising clamps for securing said outer and inner peripheral edge regions of said diaphragm to said first and second flanges, respectively.

17. The coupling of claim 16, further comprising screws for attaching said clamps to said first and second flanges with said diaphragm sandwiched between said clamps and said first and second flanges.

18. The coupling of claim 16, wherein said clamps comprise a first pair of clamps attached to said first flange and a second pair of clamps attached to said second flange.

19. A coupling between first and second chambers for preventing transfer of vibrations between the chambers and for sealing a passage between the first and second chambers, the coupling comprising:
   a first flange adapted to be attached to the first chamber and having a first internal conduit;
   a second flange adapted to be attached to the second chamber and having a second internal conduit in alignment with said first internal conduit to thereby form the passage between the first and second chambers, said second flange being separated from said first flange such that a space is defined between said first and second flanges in flow communication with said first and second internal conduits; and a diaphragm comprising at least one elastomer layer and which is secured to said first and second flanges to thereby couple said first and second flanges together and close said space between said first and second flanges in order to seal said first and second internal conduits from the ambient atmosphere.

20. The coupling of claim 19, wherein said at least one elastomer layer is made of VITON™.

21. The coupling of claim 19, wherein said diaphragm further comprises an aluminum coating arranged on said at least one elastomer layer.

22. The coupling of claim 19, wherein said diaphragm further comprises a polymer coating arranged on said at least one elastomer layer.

23. The coupling of claim 19, wherein said at least one elastomer layer comprises first and second elastomer layers, said diaphragm further comprising a fabric layer interposed between said first and second elastomer layers.

24. The coupling of claim 19, wherein said at least one elastomer layer comprises first and second elastomer layers, said diaphragm further comprising a fabric layer interposed between said first and second elastomer layers, an aluminum coating arranged on outer surfaces of said first and second elastomer layers and a polymer coating arranged on said aluminum coating.

25. The coupling of claim 19, wherein said diaphragm has an inner peripheral edge region secured to said first flange and an outer peripheral edge region secured to said second flange.

26. The coupling of claim 25, wherein said diaphragm has a middle portion between said inner and outer peripheral edge regions which is arranged in said space between said first and second flanges.

27. The coupling of claim 26, wherein said middle portion of said diaphragm arranged in said space between said first and second flanges has a bell-shape in a radial cross-section, with one side of said bell-shaped portion being arranged opposite said first flange and an opposite side of said bell-shaped middle portion being arranged opposite said second flange.

28. The coupling of claim 19, wherein said first flange has an inner periphery and said second flange has an outer periphery in opposed relationship to and spaced from said inner periphery of said first flange, a portion of said diaphragm being arranged between said first and second flanges.

29. The coupling of claim 19, wherein said first flange has an inner peripheral wall and said second flange has an outer peripheral wall in opposed relationship to and spaced from said inner wall of said first flange, a portion of said diaphragm being arranged between said first and second walls.

30. The coupling of claim 19, wherein said diaphragm is in the form of a loop having a radial thickness and has an outer radial edge region secured to said first flange and an inner radial edge region secured to said second flange.

31. A metrology system for inspecting wafers, comprising:

a floating inspection chamber maintained at vacuum pressure;

a fixed transfer chamber interposed between ambient atmosphere and said inspection chamber and subjected to alternating depressurization and repressurization;

a gate valve arranged between said inspection chamber and said transfer chamber for controlling flow communication through a passage between said inspection chamber and said transfer chamber; and a coupling arranged between said inspection chamber and said transfer chamber for preventing transfer of vibrations between said inspection chamber and said transfer chamber, and for sealing said passage between said inspection chamber and said transfer chamber, said coupling comprising:

a first flange connected to said inspection chamber and having a first internal conduit and an inner periphery;

a second flange connected to said gate valve and having a second internal conduit in alignment with said first internal conduit to thereby form said passage between said inspection chamber and said transfer chambers, said second flange having an outer periphery in opposed relationship to said inner periphery of said first flange to thereby define a space between said first and second flanges which is in flow communication with said first and second internal conduits; and a looped diaphragm having an outer peripheral edge region secured to said first flange and an inner peripheral edge region secured to said second flange to thereby couple said first and second flanges together and close said space between said first and second flanges in order to seal said first and second internal conduits from the ambient atmosphere.

32. A metrology system for inspecting wafers, comprising:

a floating inspection chamber maintained at vacuum pressure;

a fixed transfer chamber interposed between ambient atmosphere and said inspection chamber and subjected to alternating depressurization and repressurization;

a gate valve arranged between said inspection chamber and said transfer chamber for controlling flow communication through a passage between said inspection chamber and said transfer chamber; and a coupling arranged between said inspection chamber and said transfer chamber for preventing transfer of vibrations between said inspection chamber and said transfer chamber, and for sealing said passage between said inspection chamber and said transfer chamber, said coupling comprising:

a first flange connected to said inspection chamber and having a first internal conduit;

a second flange connected to said gate valve and having a second internal conduit in alignment with said first internal conduit to thereby form the passage between said inspection chamber and said transfer chamber, said second flange being separated from said first flange such that a space is defined between said first and second flanges in flow communication with said first and second internal conduits; and a diaphragm comprising at least one elastomer layer and which is secured to said first and second flanges to thereby couple said first and second flanges together and close said space between said first and second flanges in order to seal said first and second internal conduits from the ambient atmosphere.

* * * * *